US012100534B2

(12) United States Patent
Milke et al.

(10) Patent No.: US 12,100,534 B2
(45) Date of Patent: Sep. 24, 2024

(54) CONNECTING ELEMENT FOR FUNCTIONAL PARTS OF AN ELECTRICAL COMPONENT AND METHOD

(71) Applicant: TDK Electronics AG, Munich (DE)

(72) Inventors: Bettina Milke, Berlin (DE); Stefan Kuschel, Stahnsdorf (DE)

(73) Assignee: TDK Electronics AG, Munich (DE)

( * ) Notice: Subject to any disclaimer, the term of this patent is extended or adjusted under 35 U.S.C. 154(b) by 288 days.

(21) Appl. No.: 17/637,346

(22) PCT Filed: Mar. 17, 2021

(86) PCT No.: PCT/EP2021/056865
§ 371 (c)(1),
(2) Date: Feb. 22, 2022

(87) PCT Pub. No.: WO2021/185926
PCT Pub. Date: Sep. 23, 2021

(65) Prior Publication Data
US 2022/0302620 A1     Sep. 22, 2022

(30) Foreign Application Priority Data

Mar. 18, 2020   (DE) .......................... 102020107481.6

(51) Int. Cl.
*H01R 12/79*      (2011.01)
*H01B 7/17*       (2006.01)
(Continued)

(52) U.S. Cl.
CPC ........... *H01B 7/17* (2013.01); *H05K 7/20445* (2013.01)

(58) Field of Classification Search
CPC .......... H01B 7/17; H01R 12/79; H01R 13/73; H01R 13/629; H01R 13/639;
(Continued)

(56) References Cited

U.S. PATENT DOCUMENTS 7,775,115 B2   8/2010   Theuss et al.
8,111,527 B2   2/2012   Loibl et al.
(Continued)

FOREIGN PATENT DOCUMENTS

CN        209838620 U       12/2019
DE      102008042099 A1      3/2010
(Continued)

*Primary Examiner* — Timothy J Thompson
*Assistant Examiner* — Guillermo J Egoavil
(74) *Attorney, Agent, or Firm* — Slater Matsil, LLP

(57) ABSTRACT

In an embodiment a connecting element includes a base configured to be fixed to a housing, an electrical conductor and a retainer for guiding and fixing the electrical conductor, the retainer being connected to the base, wherein the electrical conductor is in direct contact with the retainer, wherein the retainer is shaped such that a first contact face of the electrical conductor is configured to contact a first functional part of an electrical component and a second contact face of the electrical conductor is configured to contact a second functional part of the electrical component, the first functional part and the second functional part being located spatially distant from each other in an interior space of the housing, and wherein the connecting element is configured to connect the first functional part and the second functional part.

14 Claims, 2 Drawing Sheets

(51) Int. Cl.
*H01R 13/629* (2006.01)
*H01R 13/639* (2006.01)
*H01R 31/06* (2006.01)
*H05K 7/20* (2006.01)

(58) Field of Classification Search
CPC ............... H01R 2201/26; H01R 31/06; H05K 7/20445; H05K 7/20
USPC ............................................ 174/168; 73/727
See application file for complete search history.

(56) References Cited

U.S. PATENT DOCUMENTS

| | | | |
|---|---|---|---|
| 9,234,807 B2 | 1/2016 | Kubiak et al. | |
| 2003/0217837 A1* | 11/2003 | Luo | H01L 23/373 |
| | | | 257/E23.11 |
| 2011/0290032 A1* | 12/2011 | Wang | G01L 19/147 |
| | | | 73/727 |

FOREIGN PATENT DOCUMENTS

| | | |
|---|---|---|
| DE | 102010013321 A1 | 10/2011 |
| DE | 102007012335 B4 | 10/2013 |
| WO | 2008128815 A2 | 10/2008 |

\* cited by examiner

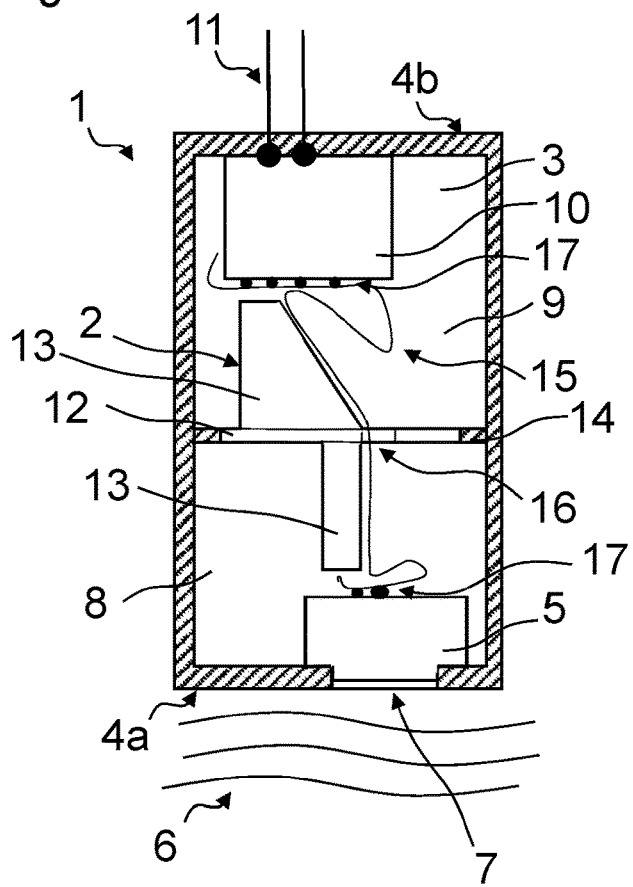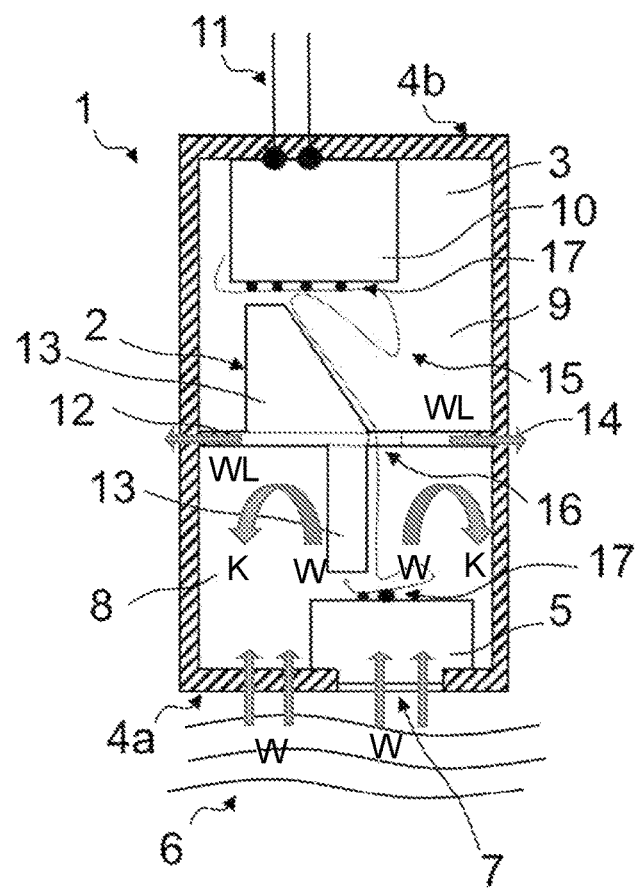

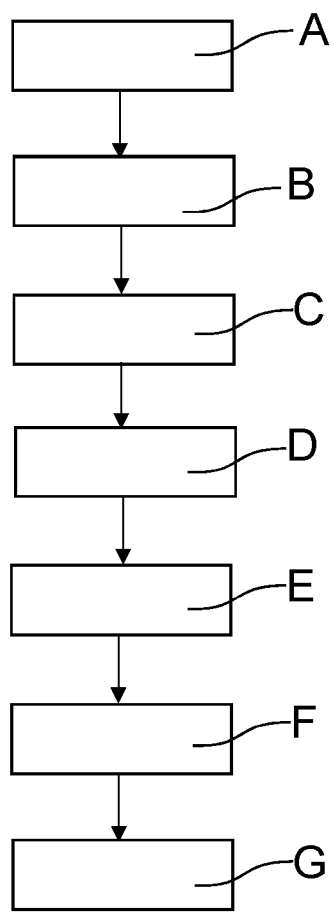

CONNECTING ELEMENT FOR FUNCTIONAL PARTS OF AN ELECTRICAL COMPONENT AND METHOD

This patent application is a national phase filing under section 371 of PCT/EP2021/056865, filed Mar. 17, 2021, which claims the priority of German patent application 102020107481.6, filed Mar. 18, 2020, each of which is incorporated herein by reference in its entirety.

TECHNICAL FIELD

The present invention relates to a connecting element for connecting a first and a second functional part of an electrical component, which are spaced apart from each other, in an interior space of a housing.

BACKGROUND

Two spaced functional parts of an electrical component must be connected by means of an electrical conductor. The electrical conductor is usually loose inside the housing. The loose electrical conductor presents significant potential hazards and susceptibility to failure. For example, a vibration caused by a neighboring compressor can cause the conductor to vibrate or even break.

The electrical component is, for example, a sensor, which comprises a sensor element and evaluation electronics as functional parts.

The sensor can be designed for use at high pressures and high temperatures. Such sensors are required, for example, in the automotive industry for fuel injection.

Use in high temperature ranges entails heating of the sensor element and the housing. This can be problematic because the electronics required for evaluating the sensor signals are generally only designed for operation at lower temperatures. Overheating leads to the destruction of the evaluation electronics. But even comparatively lower temperatures damage the electronics, since they accelerate aging processes. Therefore, operation in a temperature range with a defined maximum temperature is desirable.

To avoid overheating of the evaluation electronics, various approaches have been pursued up to now. On the one hand, the sensor housing can be dimensioned so long that the electronics are located at a sufficient distance from the heat source and accordingly do not heat up beyond the permissible maximum. This has the disadvantage that the housing turns out comparatively large, which results in increased material consumption and increased space requirements. In addition, a longer electrical conductor is required for contacting the sensor element with the evaluation electronics, which is loosely arranged in the housing.

Another approach pursued so far is to accommodate the evaluation electronics in a second housing, independent of the first housing. The two housings can be arranged at any distance from each other and are electrically connected by cables, for example. However, a second housing entails increased equipment costs, increased material consumption and increased space requirements. Furthermore, there remains the problem of the loose electrical conductor with considerable potential danger and susceptibility to error.

SUMMARY

Embodiments provide an improved connection between two functional parts of an electrical component.

Embodiments provide a connecting element for connecting a first and a second functional part of an electrical component. The functional parts are spatially distant from each other. They are located in an interior space of a housing. The connecting element comprises a base for fixing to the housing. Furthermore, the connecting element comprises an electrical conductor and a retainer connected to the base for guiding and fixing the electrical conductor. The electrical conductor is in direct contact with the retainer. The retainer is shaped such that a first contact face of the electrical conductor contacts the first functional part, and a second contact face of the electrical conductor contacts the second functional part.

The retainer of the connecting element thus supports the electrical conductor. The electrical conductor is not loosely in the interior of the housing any more. Rather, the conductor is guided along the retainer from a first to a second functional part. The electrical conductor is in contact with both functional parts via contact faces. The retainer is geometrically designed in such a way that the contact faces of the electrical conductor can be connected to corresponding contact faces of the functional parts after installation of the connecting element in the housing.

The installation of the electrical conductor at the connecting element also facilitates the installation of the electrical conductor in the housing. In particular, the installation of movable conductors in a narrow housing is greatly facilitated by the disclosed connecting element.

The electrical conductor is mechanically attached to the retainer. Several types of attachment are possible. For example, the electrical conductor may be glued to the retainer. In the case of an electrical conductor in the form of a FlexPCB (flexible printed circuit board), for example, the conductor may also be attached by a heat embossing process using individual heat pins.

In various embodiments, the electrical conductor may be a cable, a ribbon cable, or a FlexPCB.

In one embodiment, the retainer and the base of the connecting element are designed as one component. The base is geometrically configured to be oriented perpendicular to the longitudinal direction of the housing and to be attached at its outer side to a guide on the inner side of the housing. The retainer is oriented in its longitudinal extension perpendicular to the base and thus parallel to the longitudinal extension of the housing.

According to one embodiment of the connecting element, the base is made of or comprises a material that is a good conductor of heat and acts as a conductor of heat from the interior to the housing.

When a region of the interior of the housing is heated by applying heat from the outside, a passive convection flow is generated in the interior of the housing as the heated air rises. When the warm air hits the base, which is a good conductor of heat and is oriented vertically in the housing, the heat is transferred from the air to the base, thus cooling the air. The base conducts the heat from the interior of the housing to the housing wall, to which the base is connected via the guide. The housing wall is made of a material with good thermal conductivity, such as stainless steel, for example, and transfers the heat to the environment. In this way, overheating of the interior of the housing can be avoided. Excessively high temperatures in the interior of the housing lead to aging or destruction of the functional parts of the electrical component located there.

In a further embodiment, the base separates a warm region in the interior of the housing from a cold region in the interior of the housing. The first functional part is present in the warm region. The second functional part is located in the cold region. In one embodiment, the warm region corresponds to the lower region of the interior space, while the cold region corresponds to the upper region of the interior space. The regions can also be arranged next to each other.

For example, the base may be a disk mounted in a cylindrical housing perpendicular to the axial direction of the cylinder. The disc is attached along its circumference to the guide on the inside of the housing. In this case, at least a portion of the circumferential surface of the base is in direct contact with the guide. However, the base need not abut the guide along its entire peripheral surface. For example, there may be a recess through which the electrical conductor is guided.

The retainer is arranged perpendicular to the base so that the first functional part in the warm region can be electrically connected to the second functional part in the cold region via the electrical conductor. The first functional part in the warm region can be, for example, a sensor element for measuring high temperatures and pressures. The second functional part in the cold region can be, for example, associated evaluation electronics.

For example, contact with a warm ambient medium heats up the lower region, which is then the warm region. The heated air rises and thus triggers passive convection. When the heated air hits the thermally conductive base, the heat is transferred to it, and the air cools and sinks again. The base may transfer some of the absorbed heat to the housing by conduction.

In one embodiment, the base may transfer the absorbed heat to the housing via directional heat conduction. This is achieved, for example, by choosing an anisotropic material for the base that conducts heat toward the housing but is thermally insulating toward the upper region. Therefore, the upper region of the interior above the base of the connecting element hardly heats up and is thus the cold region.

In one embodiment, the base and the guide on the inside of the housing are designed to allow the connecting element to be installed in the housing only in a desired orientation.

To this end, the base comprises, for example, asymmetrically positioned lugs on its circumferential side which, in accordance with a lock-and-key principle, fit into corresponding recesses in the guide only in one orientation of the connecting element.

Alternatively, the guide comprises lugs that insert into corresponding recesses in the peripheral side of the base.

In one embodiment, the base comprises a recess through which the electrical conductor is guided.

This is particularly the case when functional parts above and below the base are to be electrically connected. The size of the recess can also influence the extent to which a lower warm region and an upper cold region in the interior of the housing are thermally insulated from each other.

The recess can be positioned either at the edge or inside the base. If the recess is located at the edge of the base, the base is not attached to the guide there. If the recess is located within the base, the base is closed around the electrical conductor.

In one embodiment, the connecting element comprises an elastic material which is designed to ab dampen vibrations.

Vibrations can be transmitted to the housing from adjacent compressors in a motor vehicle, for example. In the case of a loose electrical conductor, this can lead to damage or tearing of the conductor. By fixing the conductor to an elastic mount, the vibration can be considerably damped and the conductor thus protected from damage.

In one embodiment, the connecting element is made of plastic.

The plastic can be selected according to the desired application properties of the connecting element. If the base is to thermally insulate the lower portion of the housing from the upper portion of the housing, a thermally insulating plastic such as a modification of polyphthalamide (partially aromatic polyamide, PPA) or polypropylene (PP) may be selected. PP is particularly suitable at temperatures up to 80° C. At higher temperatures, a polyamide can preferably be selected.

If the base is to have good thermal conductivity, a thermally conductive plastic such as a modification of PPA, a liquid crystal polymer (LCP) or polyphenyl terephthalamide (PPT) with a filler such as boron nitride, copper or aluminum can be used.

A thermoplastic elastomer such as olefin-based TPO or polyamide-based TPA can be used to improve vibration damping.

A plastic connecting element has the further advantage that it can be manufactured relatively easily in large quantities, for example by injection molding. Smaller quantities can be produced by 3D printing, for example. A 3D printing process further enables application-specific modifications of the connecting element.

Further embodiments provide a method for fixing an electrical conductor in a housing, comprising the following steps:

Providing a housing and a first functional part of an electrical component installed in the housing.

The first functional part is fixed, for example, in a first, lower region of the housing. This region may heat up during operation, for example due to heat supply from the environment.

Providing a connecting element by fixing an electrical conductor to a retainer connected to a base so that the electrical conductor abuts the retainer.

In one embodiment, the base and the retainer are one component. For example, the base is a planar member, such as a disk. The retainer may be configured to guide the electrical conductor perpendicular to the base.

The electrical conductor, which is for example a cable, a ribbon cable or a FlexPCB, may be mechanically attached to the retainer, for example by bonding or heat stamping.

The conductor is attached to the retainer so that it is in direct contact with it and has little room to move. In one embodiment, the ends of the electrical conductor comprising a first contact face for contacting the first functional part and a second contact face for contacting the second functional part do not abut the retainer.

Inserting the connecting element into the housing in a desired orientation.

The base of the connecting element may include certain structural elements, such as asymmetrically mounted lugs, that permit installation of the connecting element into the housing only in the desired orientation.

Attaching the base of the connecting element to a guide on the inside of the housing, The guide is located on the inside of the housing wall. The base can be mechanically attached to this. For example, the base can be glued to the guide. Alternatively, the base and the guide can be designed in such a way that the base can be inserted into the guide. The base can then additionally be glued to the guide.

The base is, for example, a disk that is attached to the guide at its circumferential side. The disc can have lugs on its circumferential side that can be inserted into corresponding recesses in the guide. An asymmetrical design of these lugs can ensure that the connecting element is installed in the desired orientation.

After fastening the base in the housing, the base, which in one embodiment has a planar design, can separate the lower region of the housing from an upper region.

Electrical contacting of a first contact face of the electrical conductor with the first functional part.

Contacting can be performed, for example, in the case of a FlexPCB by pressure contacting. Alternatively, the contacting can also be implemented as fixed contacting, for which, however, good accessibility of the contact face from the outside should be ensured.

In one embodiment, the first contact face is soldered to the first functional part. Soldering guarantees reliable contacting and mechanically connects the conductor to the first functional part.

To facilitate reliable contacting, a section at the end of the electrical conductor, designed for example as a FlexPCB, can be bent. For this purpose, the electrical conductor is designed to be suitably long so that a sufficiently large section protrudes beyond the retainer, which can then be bent. A bent section of the conductor aligned parallel to the contact face of the sensor element increases the available first contact face and supports the pressure contacting by spring effect. The larger contact face means that more solder points can be applied, for example.

Installation of a second functional part of the electrical component in the housing.

In one embodiment, the second functional part is located in a second region above the connecting element, while the first functional part is mounted below the connecting element in the housing. This is useful, for example, when the two functional parts may be heated differently.

The connecting element then separates a hot region from a cold region. By separating the temperature ranges, the functional parts can be arranged comparatively close to each other. Thus, relatively short electrical conductors can be used, which are additionally guided by the support. Loose arrangement of the electrical conductors in the housing with the associated problems and dangers can thus be effectively avoided.

Electrical contacting of a second contact face of the electrical conductor with the second functional part.

The contacting can be made, for example, by pressure contacting or fixed contacting.

In one embodiment, the second contact face is soldered to the second functional part. Soldering guarantees reliable contacting and mechanically connects the conductor to the second functional part.

To facilitate reliable contacting, the end of the electrical conductor can be bent. A bent section of the conductor aligned parallel to the contact face of the sensor element increases the available second contact face and supports the pressure contacting by spring action. The larger contact face means that more solder points can be applied, for example.

After contacting, the two present functional parts of the electrical component, for example a sensor element and the associated evaluation electronics of a sensor, are electrically connected to each other.

Once all the desired components have been installed and the electrical conductor has made contact with the first and second functional parts as desired, the housing can be closed. This can be achieved, for example, in the case of a stainless steel housing, by welding.

Various other embodiments provide a method of cooling a hot portion of an interior of a housing, comprising the steps of:

Formation of passive convection in the warm region, by which heat is transported from the location of heat supply to the cooler base.

When one side, such as the bottom surface, of the lower region of the interior of the housing is heated in use by an external heat source, the air in that region heats up. The lower region is then the warm region. The warm air rises, causing passive convection in the warm region. At the top of the warm region, this is bounded by the base of the connecting element. The warm air is able to transfer heat to the base, cools down by this process, and then descends back to the bottom of the warm region.

In another embodiment, for example, one side of a left region of the interior of the housing is heated. This region is thus the warm region. Passive convection then also occurs here due to rising of the warm air. The heat can be transferred to the well heat conducting housing. The base separates the left region of the interior from a right region. If the base is made of a heat-insulating material, it prevents heating of the right region in this embodiment, which is thus the cold region.

Directional heat conduction in the base from the interior space into the housing.

The base, which has good thermal conductivity and is made of, for example, a thermally conductive plastic such as PPA or PP, conducts at least part of the heat flow from the interior into the housing. This can be promoted, for example, by an anisotropic structure of the base. For example, the base is a planar disk that has heat-insulating properties in the axial direction and heat-conducting properties in the radial direction.

The housing can also be a good heat conductor. For example, the housing is made of stainless steel.

Transfer of heat from the housing to the environment.

The housing absorbs heat from the base at the points where the base abuts or is attached to the housing. This is then distributed within the housing, which is a good conductor of heat, and can then be dissipated to the surroundings. By dissipating heat to the outside, not only overheating of the lower warm region of the interior of the housing is avoided, but excessive heating of the upper cold region of the interior can also be avoided.

In one embodiment, for example, the warm region is heated to 180° C. The cold region does not heat above 150° C. due to the cooling effect of the connecting element. In a preferred embodiment, the region does not heat above 130° C. or, even more preferably, does not heat above 120° C. In this way, for example, rapid aging of evaluation electronics installed in the cold region can be avoided.

Thus, a functional part can be installed in the upper region, which has a higher heat sensitivity compared to the first functional part in the lower region.

BRIEF DESCRIPTION OF THE DRAWINGS

Exemplary embodiments are then described with reference to figures.

FIG. 1 shows a side view of a cross-section of a housing containing a first embodiment of the connecting element;

FIG. 2 shows a schematic representation of a cooling process for the first embodiment example of the connecting element; and FIG. 3 shows a schematic illustration of a process for fixing an electrical conductor as part of the connecting element in a housing.

DETAILED DESCRIPTION OF ILLUSTRATIVE EMBODIMENTS

FIG. 1 shows a side view of a cross-section of a housing 1 containing a first embodiment example of the connecting element 2. The housing 1 has the shape of a closed cylinder.

The housing 1 encloses an interior space 3. In the embodiment example, the housing 1 is made of thermally conductive stainless steel. A first functional part 5 of an electrical component is attached to the bottom surface 4a of the housing 1. In the embodiment example, the component is a sensor and the first functional part 5 is a sensor element. The sensor element is in contact with a medium 6 to be analyzed. The housing 1 is sealed with respect to the medium 6, for example by means of a diaphragm 7.

In the upper region 9 of the housing 1, a second functional part 10 is attached to the top surface 4b of the electrical component. The second functional part 10 is a circuit board on which the required evaluation electronics are mounted.

The evaluation electronics are contacted to the outside by means of electrical leads 11.

Between the sensor element 5 and the circuit board 10, the connecting element 2 is installed in the interior of the housing 1. The connecting element 2 comprises a base 12 designed as a disk. The base 12 is positioned such that the axis of the disk is parallel to the axis of the housing 1. Thus, the surface of the base 12 is arranged parallel to the bottom surface 4a and the top surface 4b.

The base 12 is bonded along its circumferential side to a guide 14 on the inner wall of the housing 1. The guide 14 may include lugs that fit into corresponding recesses of the base 12 only in the case of correct positioning and orientation of the connecting element 2. In this way, incorrect installation of the connecting element 2 can be prevented. Alternatively, the lugs may be provided on the peripheral side of the base 12 and the recesses may be correspondingly formed in the guide 14.

By positioning the base 12 parallel to the bottom surface 4a and top surface 4b of the housing 1, the base 12 divides the housing into a lower region 8 and an upper region 9.

Perpendicularly thereto, the same component comprises a retainer 13. The retainer 13 extends along the longitudinal direction of the housing 1 so that it nearly reaches the sensor element 5 at the bottom surface 4a of the housing 1 and nearly reaches the circuit board 10 at the top surface 4b of the housing 1. Thus, the retainer extends from both the base to the bottom surface 4a and from the base to the top surface 4b of the housing 1.

The retainer 13 is geometrically configured to terminate over a contact face of each of the functional components 5 and 10.

The component comprising base 12 and retainer 13 is made of plastic, such as PPA.

An electrical conductor 15 is attached to the retainer 13 by bonding. As an alternative to bonding, the electrical conductor 15 may be attached by heat embossing.

The conductor 15 is for example a FlexPCB, but may also be a cable or a ribbon cable.

For an attachment of the conductor 15 designed as a FlexPCB by heat embossing, the conductor 15 has recesses. Thus, the conductor 15 can be plugged onto pins attached to the surface of the retainer 13. The end of a pin projecting beyond the conductor 15 can then be melted by heating and formed into a wide head, so that the conductor 15 can no longer be detached from the retainer 13.

Consequently, the conductor 15 fits snugly against the retainer 13 along its entire length. The retainer 13 guides the conductor 15 from a contact face of the circuit board 10 to a contact face of the sensor element 5. In the base 12, which in the present embodiment occupies an entire cross-sectional area of the housing 1, a recess 16 is provided through which the electrical conductor 15 can be guided. At this point, the conductor 15 is surrounded on all sides by the base 12.

At each end of the retainer 13, a section of the electrical conductor 15 projects upwardly and downwardly, respectively, and is bent in such a way that a sufficiently large contact face of the conductor parallel to the contact faces of the functional parts is available for electrically contacting. In addition, the bending of the conductor 15 supports a pressure contact between conductor 15 and functional parts by spring effect.

The contacting between the contact faces of the conductor 15 and the functional parts 5 and 10 is achieved by soldering 17. At the same time, the solderings 17 mechanically connect and fasten the conductor to the functional parts.

In FIG. 2, the first embodiment example is shown during operation. In the embodiment example, the sensor element 5 measures the temperature of the medium 6. At high temperatures of the medium 6, the sensor element 5 and the lower region 8 of the interior space 3 of the housing 1 also heat up. As the air in the lower region 8 heats up, it begins to rise, causing passive convection. The warm air W rises until it reaches the base 12, which closes the lower region at the top. The heat can be transferred from the air to the base 12, where the air K cools down and sinks back into the housing 1, so that the convection circuit is closed.

In the present example, the base 12 has anisotropic properties. In its axial direction, the disk-shaped base 12 is thermally insulated, while in its radial direction it is a good heat conductor. Thus, the base 12 conducts heat outwardly to the housing 1. Since the housing 1 is made of stainless steel and is a good thermal conductor, the heat is distributed over the housing and is then released to the environment and distributed via convection.

The process described can prevent the warm lower region 8 from overheating. In practice, temperatures of up to 180° C. can occur here. Furthermore, the cooling process described prevents excessive heating of the upper, cooler region 9. A more heat-sensitive functional part, such as the circuit board with evaluation electronics 10, can thus also be installed here. To avoid destroying the evaluation electronics, the upper region 9 should not be heated above 150° C. To prevent rapid aging of the evaluation electronics, in a preferred embodiment the upper region should not be heated above 130° C., or even more preferably not above 120° C.

FIG. 3 shows a schematic diagram of a process for fixing the electrical conductor as part of the connecting element in the housing.

In a first step A the cylindrical housing 1 is provided. The sensor element 5 is already attached to the bottom surface 4a of the housing 1.

In a further step B the connecting element 2 is assembled. For this purpose, the described component, comprising the disk-shaped base 12 and the retainer 13 perpendicular thereto, is provided. The component is made of plastic and can be produced, for example, by injection molding or 3D printing.

An electrical conductor 15 is fixed to the plastic component. The conductor 15 is, for example, a FlexPCB, which is bonded to the retainer 13 in a planar manner. After fixation, the conductor 15 lies directly against the retainer 13. Since the conductor 15 is longer than the retainer 13, a section of the conductor 15 protrudes at both ends of the retainer 13.

The assembled connecting element 2 is inserted into the housing 1 in a desired orientation in step C. The retainer 13 is shaped so that the ends of the conductor 15 face the contact faces of the sensor element 5 and the circuit board 10 after installation.

To ensure that the connecting element 2 is installed in the desired orientation, the peripheral side of the base 12 includes three asymmetrically arranged lugs. During installation in step D, these three lugs fit into three corresponding recesses of the guide 14 on the inner wall of the housing 1. To fix the connecting element 2, it is glued to the guide 14.

After the connecting element 2 has been installed in the housing 1, the electrical conductor 15 is electrically contacted with the sensor element 5 in step E. The contact point should be located outside the sensor element 5. For this purpose, the contact point should be accessible from outside the housing 1. This can be ensured, for example, by an opening in the housing 1 that is not closed until later.

For contacting, the protruding section of the conductor 15 is bent so that a sufficiently large contact face of the conductor 15 is opposite a contact face of the sensor element 5. The two contact faces are then electrically and mechanically connected by soldering 17.

In a further step F, the circuit board 10 with the evaluation electronics is attached to the top surface 4b of the housing 1. This step can take place before or after installation of the connecting element 2, depending on the accessibility of the corresponding location in the interior space 3 of the housing 1.

Once the connecting element 2 and the circuit board 10 have been installed in the housing 1, the electrical conductor 15 can be contacted with the circuit board 10 in step G. The electrical conductor 15 is then connected to the circuit board 10. For this purpose, the corresponding projecting end of the conductor 15 is bent in such a way that a sufficiently large contact face is opposite a corresponding contact face on the circuit board 10. The circuit board 10 and conductor 15 are then electrically and mechanically connected by soldering 17. The ends of the conductor projecting above and below can alternatively be bent to the desired shape before the connecting element 2 is installed.

Once all fixing and contacting steps have been completed, the housing is closed by welding.

The description of the objects disclosed herein is not limited to the individual specific embodiments. Rather, the features of the individual embodiments can be combined with each other in any way—as far as this makes technical sense.

The invention claimed is:

1. A connecting element comprising:
a base configured to be fixed to a housing, wherein the base consists of a heat-conducting material and acts as a heat conductor from an interior space to the housing, and wherein the base separates a warm region from a cold region in the interior space;
an electrical conductor; and
a retainer configured to guide and fix the electrical conductor, the retainer being connected to the base,
wherein the electrical conductor is in direct contact with the retainer,
wherein the retainer is shaped such that a first contact face of the electrical conductor is configured to contact a first functional part of an electrical component and a second contact face of the electrical conductor is configured to contact a second functional part of the electrical component, the first functional part and the second functional part being located spatially distant from each other in the interior space of the housing, and
wherein the connecting element is configured to connect the first functional part and the second functional part, and
wherein the first functional part is located in the warm region and the second functional part is located in the cold region.

2. A method for cooling the warm region of the interior space of the housing according to claim 1, the method comprising:
forming a passive convection in the warm region, by which heat is transported from a location of a heat supply to a cooler base;
directionally heat conducting in the base from the interior space into the housing; and
transferring the heat from the housing to an environment.

3. The connecting element according to claim 1, wherein the base and a guide on an inside of the housing are configured such that the connecting element is only installable in the housing in a desired orientation.

4. The connecting element according to claim 1, wherein the base comprises a recess through which the electrical conductor is guided.

5. The connecting element according to claim 1, wherein the connecting element comprises an elastic material designed to dampen vibrations.

6. A method for fixing an electrical conductor in a housing, the method comprising:
providing the housing and a first functional part of an electrical component, which is installed in the housing;
providing a connecting element by fixing the electrical conductor to a retainer connected to a base so that the electrical conductor abuts the retainer, wherein the connecting element consists of plastic;
inserting the connecting element into the housing in a desired orientation;
fixing the base of the connecting element to a guide on an inside of the housing;
electrically contacting a first contact face of the electrical conductor with the first functional part;
installing a second functional part of the electrical component in the housing; and
electrically contacting a second contact face of the electrical conductor with the second functional part.

7. A connecting element comprising:
a base configured to be fixed to a housing;
an electrical conductor; and
a retainer configured to guide and fix the electrical conductor, the retainer being connected to the base,
wherein the electrical conductor is in direct contact with the retainer,
wherein the retainer is shaped such that a first contact face of the electrical conductor is configured to contact a first functional part of an electrical component and a second contact face of the electrical conductor is configured to contact a second functional part of the electrical component, the first functional part and the second functional part being located spatially distant from each other in an interior space of the housing,
wherein the connecting element consists of plastic, and
wherein the connecting element is configured to connect the first functional part and the second functional part.

8. The connecting element according to claim 7, wherein the base consists of a heat-conducting material and acts as a heat conductor from the interior space to the housing.

9. The connecting element according to claim 8, wherein the base separates a warm region from a cold region in the interior space, and wherein the first functional part is located in the warm region and the second functional part is located in the cold region.

10. A method for cooling the warm region of the interior space of the housing according to claim 9, the method comprising:
   forming a passive convection in the warm region, by which heat is transported from a location of a heat supply to a cooler base;
   directionally heat conducting in the base from the interior space into the housing; and
   transferring the heat from the housing to an environment.

11. The connecting element according to claim 7, wherein the base and a guide on an inside of the housing are configured such that the connecting element is only installable in the housing in a desired orientation.

12. The connecting element according to claim 7, wherein the base comprises a recess through which the electrical conductor is guided.

13. The connecting element according to claim 7, wherein the connecting element comprises an elastic material designed to dampen vibrations.

14. A method for fixing an electrical conductor in a housing, the method comprising:
   providing the housing and a first functional part of an electrical component, which is installed in the housing;
   providing a connecting element by fixing the electrical conductor to a retainer connected to a base so that the electrical conductor abuts the retainer, wherein the base consists of a heat-conducting material and acts as a heat conductor from an interior space to the housing, and wherein the base separates a warm region from a cold region in the interior space;
   inserting the connecting element into the housing in a desired orientation;
   fixing the base of the connecting element to a guide on an inside of the housing;
   electrically contacting a first contact face of the electrical conductor with the first functional part;
   installing a second functional part of the electrical component in the housing; and
   electrically contacting a second contact face of the electrical conductor with the second functional part,
   wherein the first functional part is located in the warm region and the second functional part is located in the cold region.

* * * * *